United States Patent
Kimura

(10) Patent No.: US 7,116,537 B2
(45) Date of Patent: Oct. 3, 2006

(54) SURGE CURRENT PREVENTION CIRCUIT AND DC POWER SUPPLY

(75) Inventor: Hiroyuki Kimura, Miyagi (JP)

(73) Assignee: Freescale Semiconductor, INC, Austin, TX (US)

( * ) Notice: Subject to any disclaimer, the term of this patent is extended or adjusted under 35 U.S.C. 154(b) by 0 days.

(21) Appl. No.: 11/300,075

(22) Filed: Dec. 14, 2005

(65) Prior Publication Data

US 2006/0132999 A1 Jun. 22, 2006

(30) Foreign Application Priority Data

Dec. 20, 2004 (JP) .............................. 2004-368391

(51) Int. Cl.
*H02H 9/00* (2006.01)

(52) U.S. Cl. .................. 361/58; 361/93.1; 361/93.5; 361/100; 361/111; 361/118; 323/908

(58) Field of Classification Search ............... 361/93.1, 361/93.5, 110, 111, 118, 58; 323/908
See application file for complete search history.

(56) References Cited

U.S. PATENT DOCUMENTS

| | | | | |
|---|---|---|---|---|
| 5,079,455 A | * | 1/1992 | McCafferty et al. | 327/318 |
| 5,283,707 A | * | 2/1994 | Conners et al. | 361/58 |
| 5,500,610 A | * | 3/1996 | Burstein | 326/85 |
| 5,844,440 A | * | 12/1998 | Lenk et al. | 327/322 |
| 6,127,854 A | * | 10/2000 | Illegems | 327/66 |
| 6,225,797 B1 | * | 5/2001 | Willis et al. | 323/351 |
| 6,646,842 B1 | * | 11/2003 | Pan et al. | 361/58 |
| 6,865,063 B1 | * | 3/2005 | Ball | 361/93.9 |
| 2004/0169981 A1 | * | 9/2004 | Werback et al. | 361/93.9 |
| 2006/0050541 A1 | * | 3/2006 | Terdan | 363/70 |

FOREIGN PATENT DOCUMENTS

| | | |
|---|---|---|
| JP | 4-65947 | 10/1992 |
| JP | 5-276657 | 10/1993 |
| JP | 7-75886 | 3/1995 |
| JP | 8-272464 | 10/1996 |

* cited by examiner

*Primary Examiner*—Brian Sircus
*Assistant Examiner*—Terrence Willoughby
(74) *Attorney, Agent, or Firm*—Charles Bergere

(57) ABSTRACT

A surge current prevention circuit and DC power supply for preventing surge current in various operation applications with a small circuit configuration. A power switch connects an external power supply and a load. A first PMOS transistor is connected to a constant current supply. A second PMOS transistor, which forms a current mirror, is connected to a first and second NMOS transistor. A third PMOS transistor is connected to the first and second NMOS transistor, a third NMOS transistor, and fourth and fifth NMOS transistors. A control input is connected to the third NMOS transistor. The first NMOS transistor is connected to the fourth NMOS transistor. An external power supply is connected to the second NMOS transistor. The load is connected to the fourth NMOS transistor.

5 Claims, 2 Drawing Sheets

SURGE CURRENT PREVENTION CIRCUIT AND DC POWER SUPPLY

BACKGROUND OF THE INVENTION

The present invention relates to a surge current prevention circuit and to a DC power supply using a surge current prevention circuit.

When the voltage of a DC power supply is supplied to a capacitive load including a capacitor, the rapid rise in the voltage when the power is switched ON produces surge current, which is a large current that flows to the capacitor. A fuse is provided to prevent the surge current from damaging the device. When a fuse with a high rating is selected so that the fuse does not frequently break, it may not be capable of responding to abnormal currents. To eliminate this problem, research has been carried out in relationship with surge current prevention circuits that restrict surge currents (rush current) (for example, Japanese Laid-Open Patent Publication No. 5-276657). FIG. 2 shows a circuit described in the publication that is configured in correspondence with the present invention. In the surge current prevention circuit shown in FIG. 2, a capacitive load L is connected to an external DC power supply PS by a power switch SW. The power switch SW comprises a P-channel MOS type transistor. A time constant circuit, which comprises a resistor and capacitor, and a power supply switch transistor, which receives a control signal, are connected to the gate terminal of the power switch SW.

When a predetermined DC voltage is supplied from the external power supply PS to the load L, the power source switch transistor is turned ON. This shifts the transistor of the power switch SW to an ON state. In this case, the voltage supplied to the gate of the power switch SW is determined by the time constant circuit. Accordingly, the current supplied to the capacitive load L is controlled by the transient characteristic of the time constant circuit. Therefore, current does not flow the instant the power supply switch transistor goes ON. Since the power switch SW is gradually turned ON, surge current is not produced.

Research has also been conducted in relationship with DC power supply devices configured so as to restrict surge current with high impedance when the power source is turned ON, and using low impedance during normal functioning so that the operation of the DC power supply circuit and the protective function of the fuse are not affected (for example, refer to Japanese Laid-Open Patent Publication No. 8-272464). FIG. 3 shows a circuit described in the publication that is configured in correspondence with the present invention. This technique uses a comparison circuit. The comparison circuit includes divisional transistors, which respectively detect potentials at the source terminal and the drain terminal of the power switch SW, and a comparator, which detects the difference between the two potentials. In this configuration, the output of the comparator is left open from when the power source is turned ON to when the load L is sufficiently charged so that the power switch SW is not conductive. In this state, the external power supply PS supplies the load L with current, which is restricted by a resistor connected in parallel to the transistor of the power switch. When the potential at the drain terminal is high enough, the output of the comparator is short-circuited and the power switch SW becomes conductive.

As described above, in Japanese Laid-Open Patent Publication No. 5-276657, the occurrence of surge current is prevented by controlling the gate voltage of the power switch with the time constant circuit. However, surge current changes in accordance with the power supply voltage and load. Therefore, with a fixed time constant circuit, it is difficult to control surge current that changes in accordance with various power supplies and loads. Furthermore, the circuit of Japanese Laid-Open Patent Publication No. 276657 cannot control the timing for turning ON the power switch in various operation applications.

In Japanese Laid-Open Patent Publication No. 8-272464, the occurrence of surge current is prevented by the resistor that is connected in parallel to the transistor of the power switch, and current is supplied with the power switch turned ON during normal operation. However, a further transistor is necessary for an OFF state. This increases the ON resistance. Moreover, when controlling current with resistance, an absolute value of the resistance is required. However, it is often difficult to accurately realize the desired resistance value in a typical semiconductor fabrication process. When a current is restricted by the resistance, charging takes time, and the current may change depending on the power supply or load. Furthermore, when shifting from a current restriction mode to the power switch ON state, surge current may be generated by the shifting.

SUMMARY OF THE INVENTION

It is an object of the present invention to provide a surge current prevention circuit and DC power supply capable of controlling surge current in various operation applications with a small circuit configuration.

One aspect of the present invention is a surge current prevention circuit provided with a power switch including an input terminal connected to a power supply, an output terminal connected to a load, and a control terminal for controlling current. A first control device has an output terminal connected to the input terminal of the power switch. A second control device has an output terminal connected to the output terminal of the power switch. A first current supply and a third control device, each have a control terminal connected to an input terminal of the first control device. The second control device has an input terminal connected to an output terminal of the third control device. The output terminal of the second control device is connected to the load. A second current supply is connected to an input terminal of the third control device. The control terminals of the power switch and control terminals of the first and second control devices are connected to the second current supply. An input control device connects the control terminals of the power switch and the first and second control devices to the ground.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
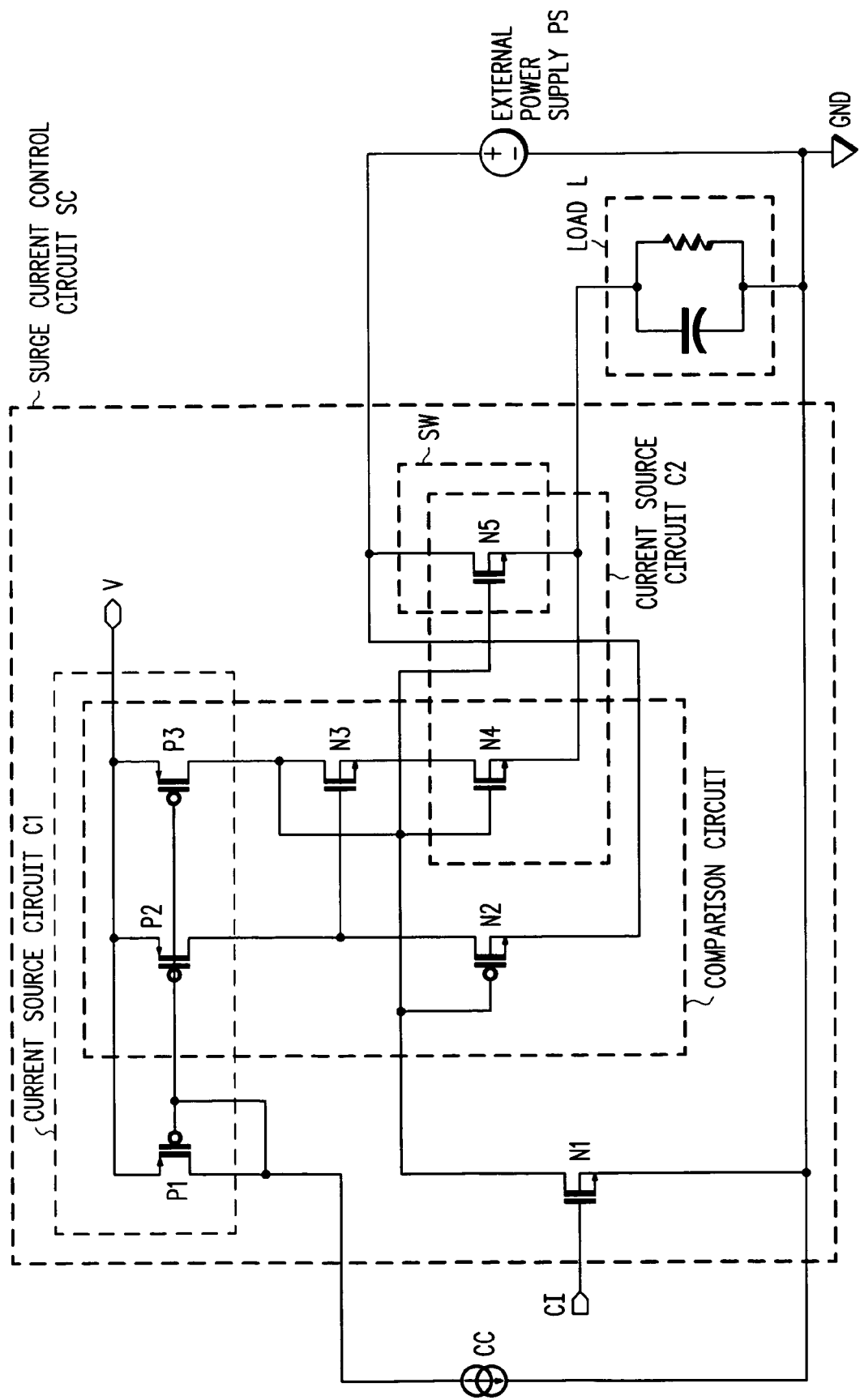
FIG. 1 is a circuit diagram of a preferred embodiment of the present invention.
Figure 2:
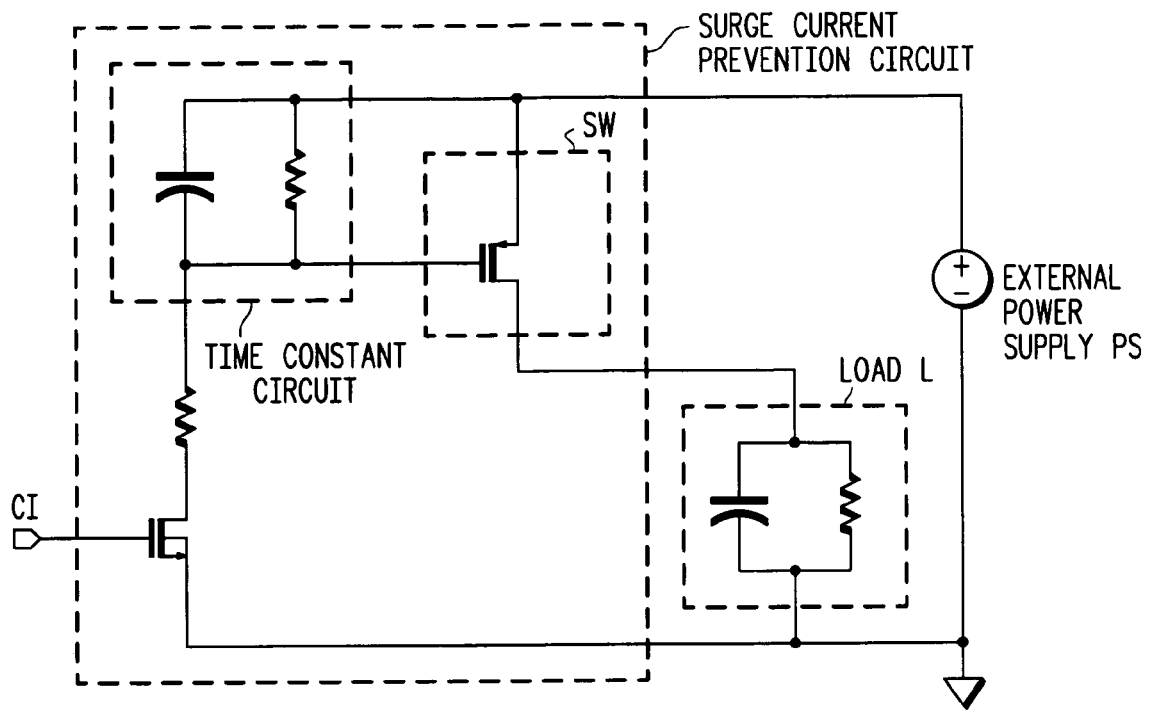
FIG. 2 is a circuit diagram of a prior art circuit.
Figure 3:
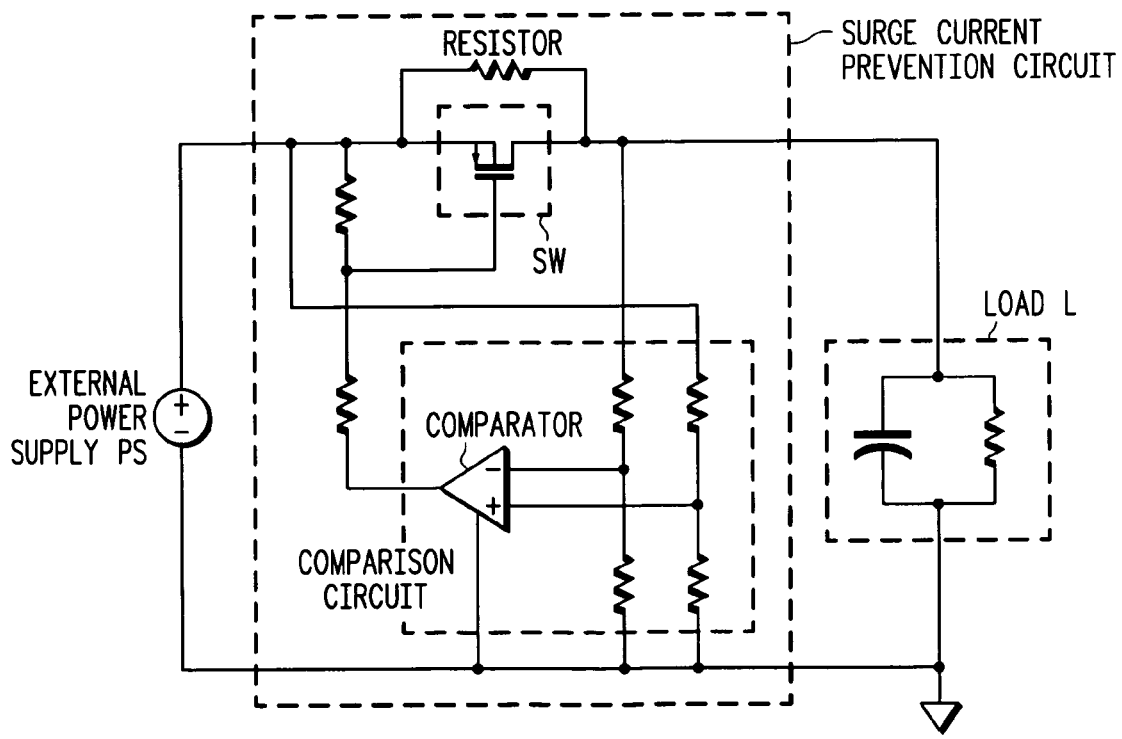
FIG. 3 is a circuit diagram of a prior art circuit.

A surge current prevention circuit SC according to a preferred embodiment of the present invention will now be described with reference to FIG. 1. A load L and an external power supply PS, which functions as a power supply, are connected to the surge current prevention circuit SC. The surge current prevention circuit SC includes a transistor N5, which functions as a power switch SW, and supplies power from the external power supply PS to the load L via the transistor N5. The transistor N5 comprises a field effect transistor, more specifically, an N-channel MOS type transistor. The external power supply PS is connected to the drain terminal of the transistor N5, and the load L is connected to the source terminal of the transistor N5. In the preferred embodiment, the gate terminal functions as a control terminal. Furthermore, the drain terminal of an N-channel MOS type transistor functions as an input terminal, and the source terminal of an N-channel MOS type transistor functions as an output terminal. The drain terminal of a P-channel MOS type transistor functions as an input terminal, and the source terminal of a P-channel MOS type transistor functions as an output terminal.

The surge current prevention circuit SC includes two current supply circuits C1 and C2 and a functional unit, which functions as a comparison circuit. The first current supply circuit C1 comprises three P-channel MOS type transistors P1, P2, and P3. A constant current device CC is connected to the drain terminal of the transistor P1. The constant current device CC functions as a reference input means for controlling current restriction.

The transistor P2 and transistor P3 form a current mirror circuit. The transistor P2 functions as a first current control device, and the transistor P3 functions as a second current control device. Further, the transistors P2 and P3 respectively function as a first current supply and a second current supply.

The drain terminal of the transistor P2 is connected to the gate terminal of a transistor N3 and the drain terminal of a transistor N2. In the preferred embodiment, the transistor N2 functions as a first control device, and the transistor N3 functions as a third control device.

The drain terminal of the transistor P3 is connected to the drain terminal of a transistor N1, the drain terminal of the transistor N3, and the gate terminals of transistors N2, N4, and N5. The transistor N1 functions as an input control device, and the transistor N4 functions as a second control device. In the preferred embodiment, the transistors N1 to N5 comprise field effect transistors, specifically, N-channel MOS type transistors.

The source terminal of the transistor N1 is grounded, and a control input CI is input to the gate terminal. The source terminal of the transistor N3 is connected to the drain terminal of the transistor N4.

The external power supply PS is connected to the source terminal of the transistor N2 in the same manner as is the drain terminal of the transistor N5. The load L is connected to the source terminal of the transistor N4.

The operation of the surge current prevention circuit SC will now be described. An OFF mode, a current restriction mode, and a complete ON mode will now be described.

[OFF Mode]

When power is not supplied to the load L, the transistor N1 is turned ON. In the preferred embodiment, the control input CI is set to an H level since an N-channel MOS type transistor is used as the transistor N1. When the control input CI is set at an H level, the transistor N1 is turned ON, and the drain terminal of the transistor N1 is grounded. Since the gate terminals of transistors N2, N4, and N5 are connected to the drain terminal of the transistor N1, the transistors N2, N4, and N5 are turned OFF. Accordingly, current does not flow to the drain terminal of the transistor P2 due to the elimination of the route through which the current flows. The drain current of the transistor P3 flows to GND via the transistor N1.

[Current Restriction Mode]

The transient period during which the control input CI changes from an H level to an L level and from when the transistor N5 shifts from an OFF state to just before it enters an ON state is described below.

When the level of the control input CI becomes low, the state of the transistor N1 changes from OFF to ON.

Since current is not flowing to the transistor N2, the drain terminal of the turned ON transistor P2 is set at an H level. The gate terminal of the transistor N3, which is connected to the drain terminal of the transistor P2, is also set to an H level. This turns ON the transistor N3.

Although the current of the transistor P3 did flow to the GND via the transistor N1, the current now flows to the load L via the transistor N3 and the transistor N4. The transistor N4 and the transistor N5 form a current mirror circuit, which functions as the second current supply circuit C2. Further, the voltage between the gate and source of the transistor N4 is equal to the voltage between the gate and source of the transistor N5. Thus, the current flowing to the transistor N5 is proportional to the current flowing to the transistor N4. This current raises the potential at the load L.

Since the voltage between the drain and source of the transistor N5 is sufficiently large, the potential is high at the source terminal of the transistor N2, which is connected to the drain terminal of the transistor N5. The OFF state of the transistor N2 is thus maintained since the voltage between the gate and the source of the transistor N2 is small. Accordingly, the gate voltage of the transistor N3 is maintained and the ON state of the transistor is held.

[Complete ON Mode]

When the current restriction mode continues, the potential at the load L increases, and the voltage between the drain and source of the transistor N5 becomes close to 0 V. As the potential at the source terminal of the transistor N5 increases, the potential at the source terminal of the transistor N4 also increases. The transistor N2 and transistor N4 have a common gate terminal. Thus, when the source potentials of the transistors N2 and N4 become the same, the same current flows to the two transistors N2 and N4. That is, the transistor N2 and transistor N4 function as a comparator (comparison circuit) of which source terminals function as inputs.

When the current flowing through the transistor N2 becomes greater than the current supplied from the transistor P2, which comprises a current source, the potential starts to decrease at the drain terminal of the transistor P2 and at the drain terminal of the transistor N2. Therefore, the potential at the gate terminal of the transistor N3, which is connected to the drain terminal of the transistor P2, also decreases such that the transistor N3 is turned OFF.

When the transistor N3 is turned OFF, the route through which current flows to the transistor P3 is eliminated. In this case, since the transistor P3 is ON, the potential increases at the drain terminal of the transistor P3.

Current does not flow to the transistor N4 when the transistor N3 is turned OFF. Thus, the transistor N4 and transistor N5 cannot act as a current mirror.

The potential increases at the gate terminal of the transistor N5, which is connected to the drain terminal of the transistor P3, and the transistor N5 is turned completely ON. The current of the transistor P2 flows through the transistors N2 and N5 via the load L.

The preferred embodiment has the advantages described below.

In the preferred embodiment, when the control input CI changes from an H level to an L level and the current restriction mode is set, the current of the transistor P3 flows to the load L via the transistor N3 and transistor N4. The transistor N4 and transistor N5 form a second current mirror. Thus, current proportional to the current flowing through the transistor N4 is supplied from the transistor N5 to the load L. The current of the transistor P3 is set by the constant current device CC. This enables restriction of the transient current value with the constant current device CC. Therefore, surge current is prevented, and the potential at the load L is gradually increased.

In the preferred embodiment, when the potential at the load L rises, the potentials at the source terminal of the transistor N2 and the source terminal of the transistor N4 become substantially the same, and the voltage increases between the gate and source of the transistor N2. In this state, current starts to flow to the transistor N2. Then, when the current flowing through the transistor N2 becomes greater than the current supplied from the transistor P2, the potential at the gate terminal of the transistor N3 decreases, and the transistor N3 is turned OFF. That is, the transistor N2 and the transistor N4 function as a comparison circuit for the voltage of the external power supply PS and the potential at the load L. As a result, when the transistor N3 is turned OFF, the transistor N4 and transistor N5 no longer function as a current mirror, and the external power supply PS supplies power to the load L via the transistor N5.

In the preferred embodiment, the transistor N4 acts as a current mirror with the transistor N5 during the current restriction mode and acting as a comparison circuit with the transistor N2 during the complete ON mode. Therefore, the surge current control circuit SC comprises fewer devices.

It should be apparent to those skilled in the art that the present invention may be embodied in many other specific forms without departing from the spirit or scope of the invention. Particularly, it should be understood that the present invention may be embodied in the following forms.

In the preferred embodiment, the first current source circuit C1 comprises the three P-channel MOS type transistors P1, P2, and P3), and the transistor P2 and transistor P3 comprise a current mirror circuit. Such current mirror circuit does not necessarily have to be used to supply current from the first current source circuit C1, and any configuration may be used as long as it controls the comparison circuit and the second current source circuit based on an input for controlling current restriction.

Although the transistors P1 to P3 are P-channel MOS type transistors and the transistors N1 to N5 are N-channel MOS type transistors in the preferred embodiment, any type of control device may be used as long as it has the same functions.

Although the external power supply PS is provided outside the surge current control circuit SC in the preferred embodiment, a DC power supply may be incorporated in the surge current control circuit SC.

The present examples and embodiments are to be considered as illustrative and not restrictive, and the invention is not to be limited to the details given herein, but may be modified within the scope and equivalence of the appended claims.

What is claimed is:

1. A surge current prevention circuit comprising:
   a power switch including an input terminal connected to a power supply, an output terminal connected to a load, and a control terminal for controlling current;
   a first control device having an output terminal connected to the input terminal of the power switch;
   a second control device having an output terminal connected to the output terminal of the power switch;
   a first current supply having an input terminal connected to an input terminal of the first control device,
   a third control device having a control terminal connected to the input terminal of the first current supply and the input terminal of the first control device, wherein the second control device has an input terminal connected to an output terminal of the third control device, and the output terminal of the second control device is connected to the load;
   a second current supply connected to an input terminal of the third control device, wherein the control terminal of the power switch and control terminals of the first and second control devices are connected to the second current supply; and
   an input control device through which the control terminals of the power switch and the first and second control devices are grounded.

2. The surge current prevention circuit according to claim 1, further comprising:
   a reference input means connected to the first current supply for controlling current supplied from the first current supply.

3. The surge current prevention circuit according to claim 1, wherein the power switch and the first, second and third control devices are each formed with a field effect transistor.

4. The surge current prevention circuit according to claim 1, wherein the first current supply comprises a first current control device, and the second current supply comprises a second current control device, the first and second current control devices having control terminals connected to a common input terminal.

5. A DC power supply, comprising:
   a surge current prevention circuit, including,
      a power switch including an input terminal connected to a power supply, an output terminal connected to a load, and a control terminal for controlling current;
      a first control device having an output terminal connected to the input terminal of the power switch;
      a second control device having an output terminal connected to the output terminal of the power switch;
      a first current supply having an input terminal connected to an input terminal of the first control device;
      a third control device having a control terminal connected to the input terminal of the first current supply and the input terminal of the first control device, wherein the second control device has an input terminal connected to an output terminal of the third control device, and the output terminal of the second control device is connected to the load;
      a second current supply connected to an input terminal of the third control device, wherein the control terminal of the power switch and control terminals of the first and second control devices are connected to the second current supply; and
      an input control device through which the control terminals of the power switch and the first and second control devices are grounded; and
   a voltage supply connected to the power switch.

* * * * *